(12) United States Patent
Okamoto (10) Patent No.: US 6,993,690 B1
(45) Date of Patent: Jan. 31, 2006

(54) MEMORY UNIT HAVING MEMORY STATUS INDICATOR

(75) Inventor: Shinken Okamoto, Toyohashi (JP)

(73) Assignee: Hagiwara Sys-Com Co., Ltd., Aichi-Ken (JP)

( * ) Notice: Subject to any disclaimer, the term of this patent is extended or adjusted under 35 U.S.C. 154(b) by 0 days.

(21) Appl. No.: 09/360,025

(22) Filed: Jul. 23, 1999

(30) Foreign Application Priority Data

Dec. 16, 1998 (JP) ................................. 10-357944

(51) Int. Cl.
*G11C 29/00* (2006.01)

(52) U.S. Cl. .................................. 714/718; 365/185.33

(58) Field of Classification Search ................ 714/718, 714/719–723, 185.33; 710/740; 324/210; 360/26, 47, 53; 365/200, 201, 185, 233, 365/232; 386/2, 47, 13, 85; 713/324, 340, 713/321

See application file for complete search history.

(56) References Cited

U.S. PATENT DOCUMENTS

| | | | | | |
|---|---|---|---|---|---|
| 4,054,903 | A | * | 10/1977 | Ninomiya | 348/498 |
| 4,296,464 | A | * | 10/1981 | Woods et al. | 710/308 |
| 4,644,539 | A | * | 2/1987 | Sato | 714/49 |
| 5,222,109 | A | * | 6/1993 | Pricer | 377/24.1 |
| 5,469,390 | A | * | 11/1995 | Sasaki et al. | 365/200 |
| 5,530,673 | A | * | 6/1996 | Tobita et al. | 365/185.04 |
| 5,615,159 | A | * | 3/1997 | Roohparvar | 365/185.07 |
| 5,644,539 | A | * | 7/1997 | Yamagami et al. | 365/185.33 |
| 6,112,984 | A | * | 9/2000 | Snavely | 235/379 |
| 6,130,837 | A | * | 10/2000 | Yamagami et al. | 365/185.09 |
| 6,175,937 | B1 | * | 1/2001 | Norman et al. | 365/188.03 |
| 6,385,085 | B2 | * | 5/2002 | Sato et al. | 365/185.03 |
| 2002/0051394 | A1 | * | 5/2002 | Tobita et al. | 365/221 |

FOREIGN PATENT DOCUMENTS

| | | |
|---|---|---|
| JP | 62-175360 | 11/1987 |
| JP | 62-290989 | 12/1987 |
| JP | 62290989 | * 12/1987 |
| JP | 63-200399 | 8/1988 |
| JP | 5-4266 | 1/1993 |
| JP | 6-236695 | 8/1994 |
| JP | 7-98993 | 4/1995 |
| JP | 9-179775 | 7/1997 |
| JP | 10-187548 | 7/1998 |

OTHER PUBLICATIONS

Flash Memory Guide Book 1996, Fujitsu, pp. 2-9.

* cited by examiner

*Primary Examiner*—Guy J. Lamarre
(74) *Attorney, Agent, or Firm*—Patterson, Thuente, Skaar & Christensen, P.A.

(57) ABSTRACT

A processing unit 12 that is provided in a memory unit 10 can transfer information that is stored in a corresponding address to a spare memory area and prohibit writing of information into the corresponding address when the number write operations to the respective addresses of flash memories 11-1 through 11-3 reaches a set number or when the error frequency in the information stored in the respective addresses reaches a set frequency. When the remaining capacity of a spare memory area reaches a set capacity, an indication lamp 14 may lit or a memory status signal may be transmitted to a processing unit 21 of a computer 20 and displayed on a display unit 30. The memory processing unit 12 may lit the indication lamp 14 when the number write operations to the respective addresses of flash memories 11-1 through 11-3 reaches a set number or when the error frequency in the information stored in the respective addresses reaches a set frequency.

20 Claims, 3 Drawing Sheets

| ADRESS | INFORMATION | TOTAL NUMBER OF RWITE OPERATIONS | |
|---|---|---|---|
| 0 1 | | | }  MAIN MEMORY AREAS |
| 0 2 | | | |
| 0 3 | | | |
| | | | |
| 8 1 | | | }  SPARE MEMORY AREAS |
| 8 2 | | | |
| | | | |

FIG. 6

MEMORY UNIT HAVING MEMORY STATUS INDICATOR

BACKGROUND OF THE INVENTION

1. Field of the Invention

The present invention relates to a memory unit that is capable of indicating the status of the memory.

2. Description of the Related Art

Recently, a non-volatile semiconductor memory known as "flash" memory has been developed and has been used in many fields.

The number of times that information, such as data and programs can be written and deleted (the number of write operations) in flash memory is limited and therefore, flash memory has a limited service life with respect to write operations. For example, some flash memories are capable of only 300,000 to 1,000,000 write operations. As the number of actual write operations approaches the upper limit, it becomes impossible to accurately write information (i.e., writing errors will occur), or the stored information may degrade (i.e., memory errors will occur). Therefore, if the useful life of a flash memory is approaching the end of reliable usage, the user will preferably transfer any data stored in the flash memory to a new memory, so that important data is not lost or damaged.

Presently, no proposals have been suggested to accurately notify an operator that the flash memory is approaching the end of its useful life. Instead, calculations of useful life have been based upon estimates of the number of write operations that have been performed in the given environment.

However, if the actual number of write operations is in fact larger than the estimated number, the flash memory may reach the end of its useful life much earlier than the operator anticipated. In this case, the operator may lose important data if the memory is not timely replaced. On the other hand, if the actual number of write operation is instead less than the estimated number, the semiconductor memory may be prematurely replaced.

SUMMARY OF THE INVENTION

It is, accordingly, an object of the invention to provide an improved memory unit.

Preferable, a memory unit is capable of indicating the status of the memory, such as the number of write operations that have been performed, the data error frequency or the remaining available memory capacity, so that the state of the memory can be reliably determined. Therefore, memory management can be performed efficiently and appropriately.

Preferably, the memory unit comprises a counter or a counting means that is capable of accurately recording the number of write operations that have been performed on the memory. In the alternative, the memory unit may comprise means for determining the number of memory errors or error frequency. The memory unit also may comprise an indicating means for indicating the state of the memory. This indicating means is not limited, and may include for example, an indication light, a display screen or any other appropriate device for communicating to the operator the status of the memory. Preferably, flash memory is utilized with the present teachings, although the present status indicators are useful for all types of memory.

The memory unit also may include means for transferring data to spare memory if the reliability of a particular memory location has been degraded from use.

Other objects, features and advantages of the present invention will be readily understood after reading the following detailed description together with the accompanying drawings and the claims.

DETAILED DESCRIPTION OF THE INVENTION

Preferably, a memory unit includes memory cells that form a memory and a status indicator or means for indicating the status of the memory. The status indicator can be utilized to report the status of the remaining useful life of the memory. For example, the memory unit may have a counter that counts the number of write operations that have been performed. The number of write operations then may be communicated to the operator in a variety of ways. For example, the indicating means may simply communicate the number of write operations that have been performed as a number. Alternatively, the indicating means may compare the number of write operations that have been performed to an expected number of write operations that can be performed before the memory cells degrade. The indicating means may indicate to the operator when a certain threshold has been reached. For example, the indicator may warn the operator when 80% or 90% of the upper limit of write operations has been reached.

The memory unit also may include a processing means that provides signals to a display. These signals can represent the useful life of the memory cells. The processing means also may supply signals to the display that represent when remaining capacity in a spare memory area of said memory reaches an upper limit. The signals also could represent an error frequency, such as write errors and memory errors, and the indication means may indicate when the error frequency reaches a predetermined threshold. The processing means can output the signal representing the memory status to an external unit.

Methods for indicating the memory status also are taught. These methods may include (1) counting each write operation, (2) comparing the number of counted write operations to a pre-determined number and (3) indicating the memory status when the number of counted write operations reaches the pre-determined number. Alternatively, methods for indicating a memory status may include (1) monitoring error occurrences for information stored in the memory, (2) determining a frequency of error occurrences, (3) comparing the frequency of error occurrences with a pre-determined frequency and (4) indicating when the frequency of error occurrences reaches the predetermined frequency.

In addition, methods are taught for indicating a memory status in order to shift information stored in the corresponding address to a spare memory area either when (1) the number of write operations for particular addresses reaches a pre-determined number and/or (2) the frequency of error occurrences for information stored in the particular addresses of the memory reaches a pre-determined frequency. Such methods may include (1) determining remaining capacity of a spare memory area whenever information stored in the memory is shifted to the spare memory area, (2) comparing the remaining capacity of the spare memory area with a pre-determined remaining capacity and (3) indicating when the remaining capacity of the spare memory area reaches the pre-determined remaining capacity.

Each of the additional features and method steps disclosed above and below may be utilized separately or in conjunction with other features and method steps to provide improved memory units and methods for designing and using such memory units. Representative examples of the present invention, which examples utilize many of these additional features and method steps in conjunction, will now be described in detail with reference to the drawings. This detailed description is merely intended to teach a person of skill in the art further details for practicing preferred aspects of the present teachings and is not intended to limit the scope of the invention. Only the claims define the scope of the claimed invention. Therefore, combinations of features and steps disclosed in the following detail description may not be necessary to practice the invention in the broadest sense, and are instead taught merely to particularly describe representative and representative examples of the invention.

Figure 1:
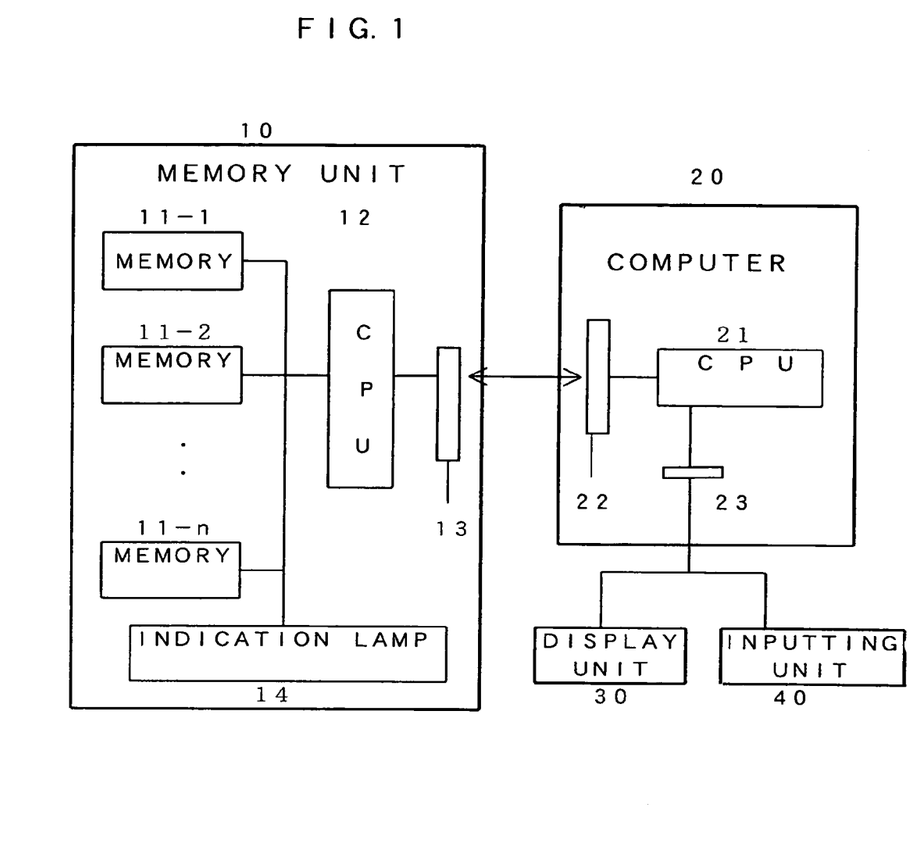
FIG. 1 is a view of a representative embodiment of a memory unit according to the present teachings.
Figure 2:
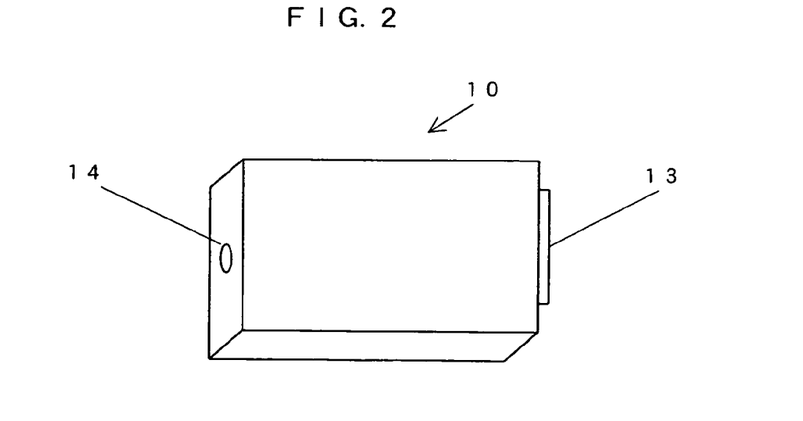
FIG. 2 is a perspective view the representative embodiment of the memory unit according to the present teachings.

A detailed description will now be given of a representative example with reference to the accompanying drawings. FIG. 1 is a view of the representative embodiment showing a memory unit installed in a computer, such as a personal computer. FIG. 2 is a perspective view showing the memory unit in a packaged form.

A memory unit 10 may have flash memories 11-1 through 11-n, a central processing unit (CPU) 12, an indication lamp 14, such as a light emitting diode or other light emitting lamp, and a connection interface 13 for connecting to a computer 20. The computer 20 preferably has a central processing unit (CPU) 21, a first connection interface 22 for connecting to the memory unit 10, a second connection interface 23 for connecting to a display unit 30, such as a CRT, a liquid crystal display or a display lamp, and means for inputting data 40 into the computer, such as a keyboard and a mouse. In this example, the memory connection interface 13 and the computer connection interface 22 may be of the same type as a connection interface by which the computer 20 is connected to the existing memory unit such as a hard disk.

According to the discussion provided above, the flash memories 11-1 through 11-n are representative of a memory or memory cell, the memory processing unit 12 is representative of a processing means, the indication lamp 14 is representative of a status indicator, and the computer 20 and the display unit 30, etc., are representative of an external unit.

In one representative embodiment the memory unit 10 may operate in the following manner. The computer processing unit 21 transmits information to the memory processing unit 12 via the connection interfaces 22 and 13. The data may include, for example, data, programs, write instructions including the write address (logic address), and read instructions including the write address (logic address) to which the information is written. When the memory processing unit 12 receives a write instruction from the computer processing unit 21, the memory processing unit 12 writes the information included in the write instruction to an optional address (physical address) selected from the addresses for the flash memories 11-1 through 11-n. The information is preferably written in flash memories 11-1 through 11-n.

At the same time, the memory processing unit 12 stores the relation of correspondence between the write address (logic address) in which the write instruction is written and an address (physical address) of the flash memories 11-1 through 11-n in which information is written, for example, in an address correlation list (correlation list between logic addresses and physical addresses). Further, when writing information to flash memories 11-1 through 11-n, various methods can be utilized to select an optional address among addresses where information can be rewritten. For example, the lowest-numbered address can always be selected, the addresses can be selected sequentially beginning with the lowest-numbered address (after the highest-numbered address is selected, the lowest-numbered address can be selected again), or the address can be selected at random. In order to efficiently use a flash memory, the addresses are preferably selected so that the same number of write operations have been performed at each address, i.e., data has been written to each memory cell the average number of times.

Further, when the memory processing unit 12 receives a read instruction from the computer processing unit 21, the memory processing unit 12 retrieves the address (physical address) of the flash memories 11-1 through 11-n that corresponds to the write address (logic address) included in the read instruction. The physical address is selected based on the address correlation list and the memory processing unit 12 reads the information written in the retrieved address from the flash memories 11-1 through 11-n. Accordingly, the memory processing unit 12 transmits the read information to the computer processing unit 21 via the connection interfaces 13 and 22. The computer processing unit 21 then operates on the basis of the received information or displays the received information on the display unit 30.

Figure 3:
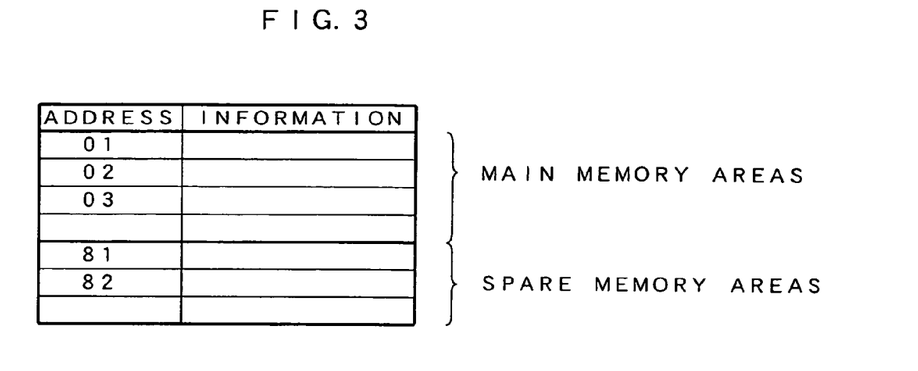
FIG. 3 depicts a first representative example of a memory status of a flash memory.

One preferred example of a memory status of the flash memories 11-1 through 11-n is illustrated in FIG. 3. In FIG. 3, each of the flash memories is divided into a main memory area and a spare memory area. Information to be written in the flash memories 11-1 through 11-n preferably includes a data portion and a redundant portion. The redundant portion preferably contains an error checking code, such as a parity bit. With this error check code, the processor can determine whether any of the data bits is erroneous, and thereby determine whether a writing or memory error has occurred. Further, by using the error check code, erroneous bits can be corrected if the number of erroneous bits is a predetermined number of bits or less.

The memory processing unit 12 usually writes information to an optional address, in which information can be rewritten, in the main memory area of the flash memories 11-1 through 11-n. However, as the number of write operations performed at respective addresses of the flash memories 11-1 through 11-n increases, writing and/or memory errors may occur at such addresses, making it impossible to reliably write and store information. In order to prevent such addresses from being overused, the memory processing unit 12 preferably calculates the number of write operations and/or the error frequency at the respective addresses of the flash memories 11-1 through 11-n. When the number of write operations reaches a set or pre-determined number of times, or when the error frequency reaches a set or pre-determined frequency, no further information is written to the corresponding address. Instead, the memory processing unit 12 can transfer the information stored in the corresponding address to the spare memory area.

When shifting or transferring information to a spare memory address, a correlation between an address (physical address) before shifting and an address (physical address) after the shifting or a correlation between the writing address (logic address) and the address (physical address) after the shifting can be stored, for example, in an address correlation list. A process for shifting the information stored in the respective addresses to the spare memory area and a process for prohibiting writing of information can also be utilized for the spare memory area.

The memory processing unit 12 preferably detects the status of flash memories 11-1 through 11-n and either (1) controls the indication lamp 14 in accordance with the status of the flash memories 11-1 through 11-n or (2) transmits a memory status signal to the computer processing unit 21 of the external computer 20. The computer processing unit 21 can display the status of the flash memories 11-1 through 11-n, for example, on the display unit 30 based upon the memory status signal generated by the memory processing unit 12.

A representative method for detecting the status of the flash memories 11-1 through 11-n in the memory unit 10 and either (1) controlling the indication lamp 14 in accordance with the detected status or (2) displaying the status of the memory on the display unit 30 also will be described. As noted above, when the number of write operations to the respective addresses of the flash memories 11-1 through 11-n reaches a set or pre-determined number, or when the error frequency at the respective addresses reaches a set or pre-determined frequency, the information written in the corresponding address is shifted or transferred to the spare memory area. As information is stored in the spare memory area, the available capacity of the spare memory area is reduced. When the remaining available spare memory area capacity becomes zero, i.e., the spare memory area is completely filled with information, further information can not be shifted or transferred to the spare memory area. In such case, the operator is preferably notified that the spare memory areas of the flash memories 11-1 through 11-n has no remaining available storage capacity. As a result, the operator is warned to perform maintenance work, such as replacement of the memory unit 10 or the flash memories 11-1 through 11-n, before information is lost or damaged. In addition or in the alternative, the operator can be warned when the number of write operations or the error frequency has reached a set number.

In one preferred embodiment, the indication lamp 14 can be lit in accordance with the results of the comparison between the remaining capacities of the spare memory areas of the flash memories 11-1 through 11-n and the established remaining capacities thereof, so as to display the memory status at the display unit 30. A flow chart shown in FIG. 4 describes one representative example of determining when the indication lamp 14 should be lit, according to this preferred embodiment. Various methods for controlling the indication lamp 14 are available. For example, the indication lamp 14 can simply be turned on or off to represent the status of the memory or a variety of lighting levels or colors can be utilized to provide more detailed status information to the operator. In the flow chart illustrated in FIG. 4, three levels of memory status, i.e. normal status, warning status, and extreme limit status, can be displayed by changing the lighting level or color of the indication lamp 14. Further, if the lighting status of the indication lamp 14 will have more than two levels, either a single or a plurality of indication lamps 14 may be utilized. If a single indication lamp 14 is utilized, the lighting status, for example, colors, periods of blinking, etc., of the indication lamp 14 may change in accordance with each of the lighting levels. If a plurality of indication lamps 14 are utilized, each indication lamp 14 may correspond to a respective memory status and/or to a respective memory location.

Figure 4:
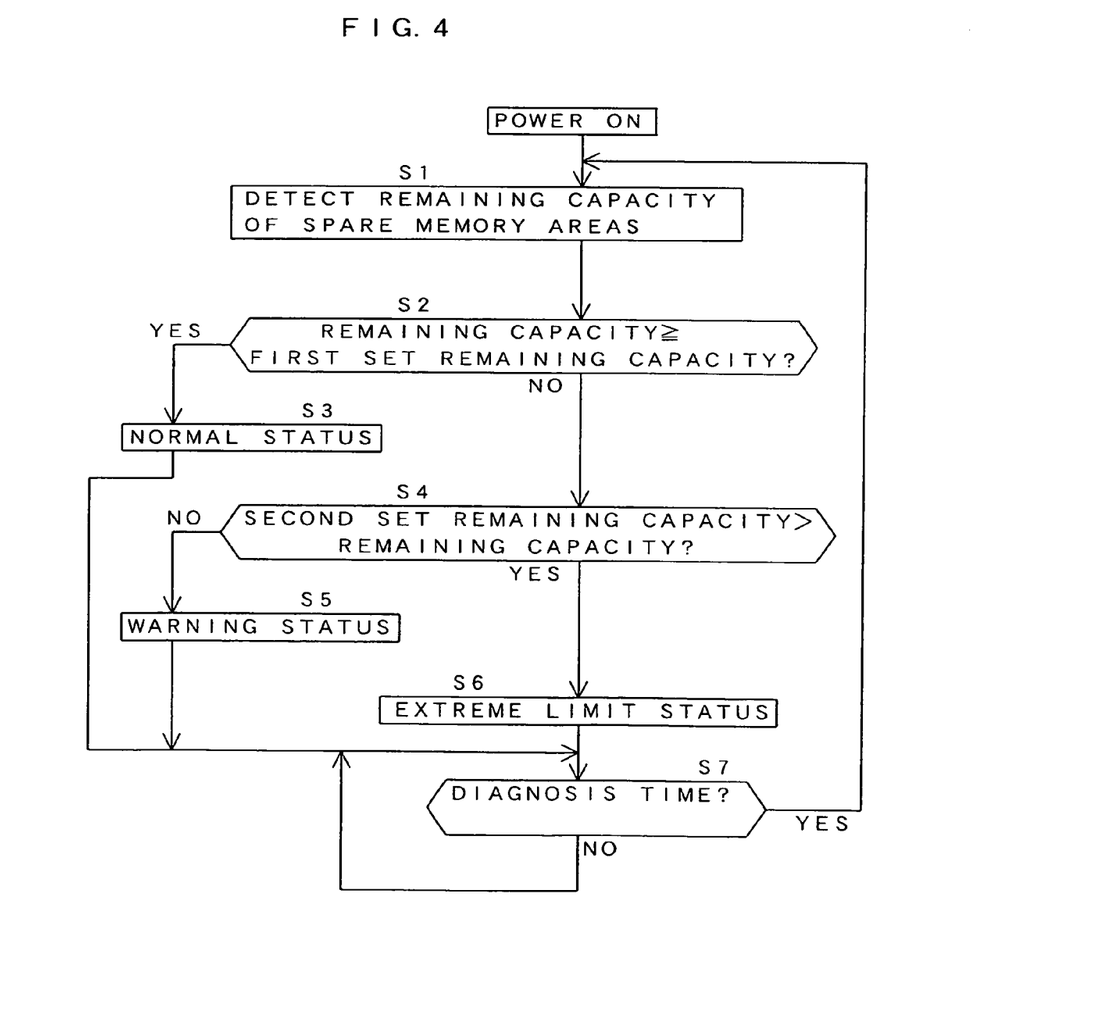
FIG. 4 is a first representative flow chart for controlling a display means.

The remaining available capacity of the spare memory areas of the respective flash memories 11-1 through 11-n (Step S1) can be detected while the memory processing unit 12 is operating. For example, the remaining available capacity of the spare memory areas of the respective flash memories 11-1 through 11-n can be detected whenever the memory processing unit 12 shifts information to the spare memory areas of the flash memories 11-1 through 11-n. The detected remaining available capacities can be stored in and read from a memory.

The memory processing unit 12 can determine whether the remaining available capacity of each of the spare memory areas of the respective flash memories 11-1 through 11-n is equal to or greater than a first set remaining available capacity amount (Step S2), which amount may be set to any appropriate pre-determined available capacity amount, such as 20% of the total capacity of the spare memory area. The first set available capacity amount may be selected based on various factors, including the size of the spare memory area. If the remaining available capacity of the spare memory areas of the respective flash memories 11-1 through 11-n is greater than the first set remaining available capacity amount, normal status is preferably displayed (Step S3). For example, a blue indication lamp 14 may be lit.

On the other hand, if any of the spare memory areas of the respective flash memories 11-1 through 11-n has a remaining available capacity that is than the first set remaining available capacity amount, the memory processing unit 12 may then determine whether any one of the remaining capacities of the respective flash memories 11-1 through 11-n is less than a second set remaining available capacity amount (Step S4). For example, the second remaining capacity may be set to 5% of the total capacities of the spare memory area.

If the remaining capacity of each of the flash memories 11-1 through 11-n is equal to or greater than the second set remaining available capacity amount, a warning status may be displayed (Step S5). For example, a yellow indication lamp 14 may be lit to inform the operator that one of the remaining available capacities of the spare memory areas of the respective flash memories 11-1 through 11-n has been reduced and that the memory unit 10 or the flash memories 11-1 through 11-n should be replaced in the near future.

If any one of the remaining available capacities of the respective flash memories 11-1 through 11-n is less than the second set remaining available capacity amount, an extreme limit state may displayed (Step S6). For example, a red indication lamp 14 may be lit to inform the operator that the remaining capacities of the spare memory areas of the flash memories 11-1 through 11-n is approaching zero. Therefore, the operator should immediately replace the memory unit 10 or the flash memories 11-1 through 11-n.

After Steps S3, S5 and S6 are completed, the memory processing unit 12 may determine whether or not a pre-determined diagnosis time has been reached (Step S7). If the diagnosis time is reached, the memory processing unit 12 returns to Step S1 and begins the status check again. The diagnosis time can be set to a variety of values. For example, the diagnosis time may be the time that is necessary to write information in the memory unit 10 or the time necessary to read information stored in the memory unit 10, once each predetermined interval of time has been reached.

The memory status check performed by the algorithm show in FIG. 4 is preferably terminated when the power is interrupted. In addition, steps S2 and S4 may or may not include codes. Further, the set remaining available capacity amount can be set to one or any other appropriate number. If the set remaining capacity is one, the status of the set remaining available capacity can be displayed by switching the indication lamp ON or OFF.

A separate indication lamp 14 can be utilized for each of the respective flash memories 11-1 through 11-n to permit the operator to individually determine the status of each of the spare memory areas of the flash memories 11-1 through 11-n. Therefore, if a single flash memory has reached the limit of its available capacity, that flash memory can be replaced, thereby reducing maintenance costs.

If the number of write operations performed in the flash memories reaches the upper limit of write operations, writing and/or memory errors may occur at an undesirable frequency, thereby making it impossible to reliably store information. Accordingly, the indication lamp 14 also may be lit according to the results of a comparison between the number of write operations to the flash memories 11-1 through 11-3 and the set or pre-determined upper limit. In the alternative, the memory status determined by this comparison may be displayed on the display unit 30.

Figure 5:
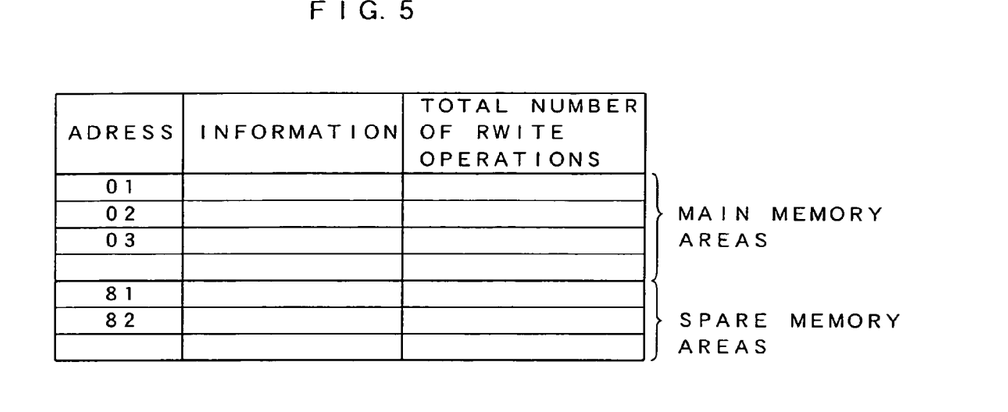
FIG. 5 depicts a second representative example of a memory status of a flash memory.

FIG. 5 shows a register for storing memory status information for the flash memories 11-1 through 11-n according to the total number of write operations performed on the flash memory. Preferably, the memory area of flash memories is divided into the main memory area and the spare memory area, as in FIG. 3. A register for storing the total number of writing operations is provided in each address of the main memory area and the spare memory area. The memory processing unit 12 writes a new value in a register that corresponds to a respective memory address each time that information is written to or deleted from the respective address. For example, after each write or delete operation, the total number of write operations is incremented by one.

Figure 6:
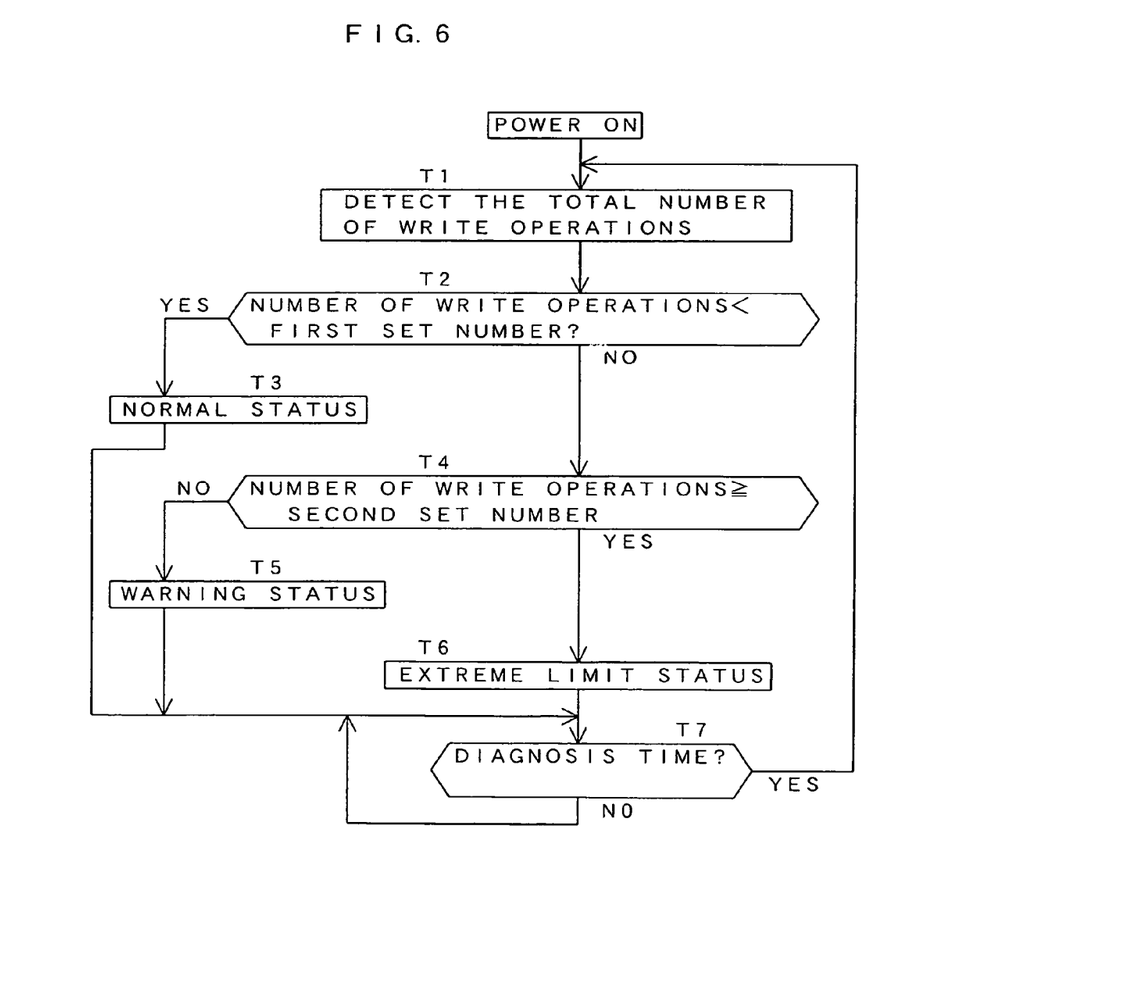
FIG. 6 is a second representative flow chart for controlling the display means.

A preferred example for indicating the memory status using the indication lamp 14 is shown in the flow chart of FIG. 6, which provides an algorithm for comparing the total number of write operations and a set or pre-determined upper limit for the respective addresses of the flash memories 11-1 through 11-n. Again, various methods may be employed as a method indicating the memory status using the indication lamp 14 as described above. According to the example provide with respect to FIG. 6, three levels of memory 11 status, i.e., normal status, warning status and extreme limit status, are indicated by changing the lighting state of the indication lamp 14.

The memory processing unit 12 preferably detects the total number of write operations for the respective addresses of the respective flash memories 11-1 through 11-n in Step T1. For example, the number of write operations is read from a number-of-write-operations register that corresponds to a respective address. The memory processing unit 12 determines whether the total number of write operations for each of the respective addresses of the respective flash memories 11-1 through 11-n is less than a first set or pre-determined number (Step T2). The first set number can be set, for example, to 80% of the upper limit of write operations. If each of the respective values is less than the first set number, a normal status is displayed (Step T3). For example, a blue indication lamp 14 may be lit.

If any one of the values is greater than the first set number, the memory processing unit 12 determines whether any one of the respective addresses of the respective flash memories 11-1 through 11-n is greater than a second set or pre-determined number (Step T4). The second set number can be set, for example, to 95% of upper limit of write operations. If any of the values is less than the second set number, a warning status is displayed (Step T5). For example, a yellow indication lamp 14 may be lit to inform the operator that the upper limit of write operations is approaching, and that the memory unit 10 or the flash memories 11-1 through 11-n should be replaced in the near future.

If any one of the values is greater than the second set number, an extreme limit status is displayed (Step T6). For example, a red indication lamp 14 may be lit to inform the operator that the upper limit of rewrite operations has been reached and that it is necessary to replace the memory unit 10 or the flash memories 11-1 through 11-n.

After Steps T3, T5 and T6 are completed, the memory processing unit 12 may determine whether or not a predetermined diagnosis time has been reached (Step T7). If the diagnosis time is reached, the memory processing unit 12 returns to Step T1 and begins the status check again. The diagnosis time can be set to a variety of values. For example, the diagnosis time may be the time that is necessary to write information in the memory unit 10 or the time necessary to read information stored in the memory unit 10, once each predetermined interval of time has been reached.

The memory status check performed by the algorithm show in FIG. 6 is preferably terminated when the power is interrupted. In addition, Steps T2 and T4 may or may not include codes. Further, when the value of in an address reaches the set or pre-determined number, the indication lamps 14 are lit or the memory status can be displayed on the display unit 30.

For example, the memory status on the display unit 30 can be displayed to indicate when the total number of write operations for each of the respective addresses in the flash memories 11-1 through 11-n is (1) less than the first set number, (2) greater than the first set number but less than the second set number and (3) more than the second set number. Further, the running total of the number of total write operations for each of the flash memories 11-1 through 11-n can be numerically displayed.

As described above, as the number of write operations increases, the error frequency also increased. If the error frequency reaches the set or pre-determined frequency, the information written in the corresponding address is shifted or transferred to the spare memory area. Thus, the indication lamp 14 can indicate the status of flash memories 11-1 through 11-n in accordance with the results of a comparison between the detected error frequency and the set frequency. In the alternative, the memory status can be displayed on the display unit 30.

A preferred example for indicating the memory status using the indication lamp 14 based upon the detected error frequency for the respective addresses of the flash memories 11-1 through 11-n will be described. Again, various methods may be employed as a method indicating the memory status using the indication lamp 14 as described above. According to this particular example, three levels of memory status, i.e., normal status, warning status and extreme limit status, are indicated by changing the lighting state of the indication lamp 14.

In response to a read instruction, the memory processing unit 12 can determine whether an error has occurred in either writing the information, or during the storage of the information. Preferably, an error code or parity bit is provided in the read information. If an error has occurred, the memory processing unit 12 can determine the frequency of error occurrences for the address in which the erroneous information was stored, for example, by calculating the total number of error occurrences in the corresponding address during a predetermined period of time.

If the calculated error frequency is less than a first set frequency, a blue indication lamp 14 may be lit, for example, to display normal status. If the calculated error frequency is greater than the first set frequency but less than a second set frequency, a yellow indication lamp 14 may be lit, for example, to display warning status. If the error frequency is greater than the second set frequency, a red indication lamp 14 may be lit, for example, to display extreme limit status. When the calculated error frequency in an address reaches the second set frequency, the memory processing unit 12 can shift the stored information to a corresponding address in the spare memory area. At the same time, the memory processing unit 12 can prohibit any further write operations to that address.

The memory status can also be shown on an external display unit 30. Naturally, by providing this memory status information using an indication lamp 14 or display unit 30, the operator can easily determine the memory status according to the error frequency of flash memories 11-1 through 11-n. In addition, the status of each of the flash memories 11-1 through 11-n can be indicated either using a plurality of indication lamps or by providing individual error frequency reports for each of the flash memories 11-1 through 11-n.

Further, an accumulated value of the number error occurrences in the respective addresses of the respective flash memories 11-1 through 11-n may be used instead of an error frequency value. In this case, the memory status is indicated based upon the results of a comparison between the accumulated value of the number error occurrences and a set or pre-determined number. In this way, the accumulated number of error occurrences in the respective addresses of the main memory areas of the respective flash memories 11-1 through 11-n or all the memory areas may be employed as a frequency of error occurrence.

Moreover, the total number of erroneous bits may be accumulated and used as a frequency of error occurrences. If an error occurs in the information written in the respective addresses of the flash memories 11-1 through 11-n, the memory processing unit 12 detects the number of erroneous bits contained in the information. If the total number of erroneous bits is less than or equal to a first set or pre-determined number, a blue indication lamp 14 may be lit, for example, to display normal status. If the total number of erroneous bits is equal greater than the first set number, but less than a second set or pre-determined number, a yellow indication lamp 14 may be lit, for example, to display warning status. If the total number of erroneous bits is equal to or greater than the second set number, the extreme limit status is displayed. Herein, for example, the second set number of bits is set to a smaller value by [1] than a predetermined number of bits at which the number of erroneous bits can be corrected to correct data, and the first set number of bits is set to a smaller value by [1] than the first set number of bits. Naturally, the first and second set numbers may be selected according to the designer's preference.

Various representative examples of modifications that can be made to the present teachings without departing from the spirit of the invention will now be described. These representative examples are not intended to be limiting.

The memory status can be indicated using an indication lamp 14 or by displaying on an external display unit 30 or both may be used. While various methods for determining the status of the memory have been described, the designer is free to select other methods for determine the memory status.

Although a plurality of flash memories have been shown in the representative memory units, the number of flash memories may be appropriately established, and may be limited to a single flash memory. In addition, while the described flash memories have been divided into the main memory areas and the spare memory areas, the present teachings are applicable to a flash memory that is not divided into the main memory area and the spare memory area. In this case, information written in an address can be shifted or transferred to a corresponding address when the number of write operations to the respective addresses reaches the set number or when the error frequency at the respective addresses reaches the set frequency. For example, the number of addresses in which the number of write operations has reached the set number of times or the number of addresses in which the error frequency has the set frequency are compared with the first and second set numbers. The memory status indication can then be performed using a similar method in accordance with the results of comparison.

When information was written in an optional address of flash memories 11-1 through 11-n, address management was performed by the memory processing unit 12. However, an external unit also may perform address management, for example, the computer processing unit 21 of the computer 20. In this case, the computer processing unit 21 monitors the number write operations to flash memories 11-1 through 11-n.

As described above, if a memory unit according to the present teachings is used, the memory status can be easily determined and the operator can be informed to timely replace a memory unit or the respective memories. In the alternative, the remaining available capacity of spare memory areas within memories can be easily determined to promptly inform the operator when the memory should be replaced.

What is claimed is:

1. A memory unit comprising:
   a flash memory having a main memory area and a spare memory area, wherein said main memory area includes a plurality of data storage registers and wherein each of said data storage registers has an address, and wherein said spare memory area has a storage capacity;
   a display; and
   a processor, wherein said processor transfers data stored in each of said addresses of said main memory area to said spare memory area upon a number of write operations performed to a respective one of said addresses in said main memory reaching a predetermined value, and wherein said processor drives said display to display an operational status representative of remaining write operations of said flash memory upon said number of write operations performed to a respective one of said addresses in said main memory reaching a predetermined number.

2. The memory unit as in claim 1, wherein said processor compares said number of write operation performed with a plurality of different values of said predetermined values, wherein the comparison produces a plurality of different results, and wherein said processor drives said display to display different operational statuses of said flash memory in different manners dependent upon said plurality of different results.

3. A memory unit comprising:
a flash memory having a main memory area and a spare memory area, wherein said main memory area includes a plurality of data storage registers and wherein each of said data storage registers has an address, and wherein said spare memory area has a storage capacity;
a display; and
a processor, wherein said processor transfers data stored in each of said addresses of said main memory area to said spare memory area upon an error frequency within one of said plurality of data storage registers reaching a predetermined frequency, and wherein said processor drives said display to display an operational status representative of error frequency of said flash memory upon said error frequency reaching a predetermined frequency.

4. The memory unit of claim 3, wherein said processor compares said error frequency with a plurality of different values of said predetermined values, wherein the comparison produces a plurality of different results, and wherein said processor drives said display to display different operational statuses of said flash memory in different manners dependent upon said plurality of different results.

5. A memory unit comprising:
a flash memory having a main memory area and a spare memory area, wherein said main memory area includes a plurality of data storage registers and wherein each of said data storage registers has an address, and wherein said spare memory area has a storage capacity;
a display; and
a processor wherein said processor transfers data stored in each of said addresses of said main memory area to said spare memory area upon a number of write operations performed to a respective one of said addresses in said main memory reaching a predetermined value, and wherein said processor drives said display to display a normal operational status representative of remaining write operations of said flash memory when the number of write operations has not reached a first set value, a warning operational status representative of remaining write operations of said flash memory when the number of write operations has reached the first set value but not a second set value, and an extreme limit operational status representative of remaining write operations of said flash memory when the number of write operations has reached a second set value.

6. The memory unit as in claim 5, wherein a remaining amount of the storage capacity in said spare memory does not reach a first set remaining amount in the normal operational status, and the remaining amount of the storage capacity reaches the first set remaining amount but does not exceed the second set remaining amount in the warning operational status, and the remaining amount of the storage capacity exceeds a second set remaining amount in the extreme limit operational status, and the display is driven to display the normal operational status, the warning operational status and the extreme limit operational status in a distinguishable manner.

7. The memory unit as in claim 6, wherein the normal operational status, the warning operational status and the extreme limit operational status are displayed in different manners.

8. The memory unit as in claim 7, wherein the normal operational status, the warning operational status and the extreme limit operational status are displayed by using different colors.

9. The memory unit as in claim 8, wherein the normal operational status, the warning operational status and the extreme limit operational status are displayed by using blue, yellow and red, respectively.

10. The memory unit as in claim 5, wherein the normal operational status, the warning operational status and the extreme limit operational status are displayed in different manners.

11. The memory unit as in claim 10, wherein the normal operational status, the warning operational status and the extreme limit operational status are displayed by using different colors.

12. The memory unit as in claim 11, wherein the normal operational status, the warning operational status and the extreme limit operational status are displayed by using blue, yellow and red, respectively.

13. A flash memory unit comprising:
a flash memory area, wherein said flash memory area stores data and wherein said flash memory area has a limited useful life in storing said data;
a spare memory area having a data storage capacity;
a display; and
a processor, wherein said processor transfers the stored data of said flash memory area to said spare memory area upon said flash memory approaching said limited useful life, and wherein said processor drives said display to display an operational status representative of remaining useful life of said flash memory by displaying an amount of remaining data storage capacity in said spare memory, wherein the operational status of the display provides an indication as to whether replacement of said flash memory area is required.

14. The flash memory unit of claim 13 wherein the limited useful life is indicated by an increase in error frequency or by a finite number of read/write operations.

15. A flash memory unit utilizing error check code (ECC) comprising:
a flash memory having a main memory area and a spare memory area, wherein said main memory area includes a plurality of data storage addresses, and wherein said spare memory area includes a plurality of data storage addresses;
a display means; and
a processor, wherein said processor transfers data stored in each of said addresses of said main memory to one of said addresses of said spare memory area upon an error frequency of said one of said addresses in said main memory area reaching a predetermined value within the error frequency that a data error in said addresses of said main memory area can be corrected by said ECC stored in said flash memory, and
wherein said processor drives said display means to activate upon a remaining amount of storage capacity in said spare memory area reaching a predetermined value representative of error frequency and upon activation display an operational status of said flash memory.

16. The flash memory unit utilizing error check code (ECC) of claim 15, wherein said processor compares said error frequency with a plurality of different values of said predetermined values, and wherein said processor drives said display means to activate in different manners depending upon a plurality of comparison results and upon activation display different operational statuses of said flash memory.

17. The flash memory unit utilizing error check code (ECC) of claim 16, wherein a normal operational status, a warning operational status, and an extreme limit operational status of said flash memory are displayed in different manners.

18. A flash memory unit utilizing error check code (ECC) comprising:
- a flash memory having a main memory area and a spare memory area, wherein said main memory area includes a plurality of data storage addresses, and wherein said spare memory area includes a plurality of data storage addresses;
- a display means; and
- a processor, wherein said processor transfers data stored in said main memory area to one of said addresses of said spare memory area upon the number of write operations performed to said addresses in said main memory area reaching a predetermined value representative of remaining write operations within possible number of write operations, and wherein said processor drives said display means to activate upon a remaining amount of storage capacity in said spare memory area reaching a predetermined value and upon activation display an operational status of said flash memory.

19. The flash memory unit utilizing error check code (ECC) of claim 18, wherein said processor compares said number of write operations to said addresses in said main memory area with a plurality of different values of said predetermined values, and wherein said processor drives said display means to activate in different manners depending upon a plurality of comparison results and upon activation display different operational statuses of said flash memory.

20. The flash memory utilizing Error Check Code (ECC) of claim 19, wherein a normal operational status, a warning operational status and an extreme limit operational status of said flash memory are displayed in different manners.

* * * * *